United States Patent [19]

Fujimura

[11] Patent Number: 5,332,919
[45] Date of Patent: Jul. 26, 1994

[54] PHOTODETECTOR WITH SURROUNDING REGION

[75] Inventor: Yasushi Fujimura, Osaka, Japan

[73] Assignee: Sumitomo Electric Industries, Ltd., Japan

[21] Appl. No.: 20,712

[22] Filed: Feb. 22, 1993

[30] Foreign Application Priority Data

Feb. 24, 1992 [JP] Japan ................................. 4-036472

[51] Int. Cl.$^5$ ............................................. H01L 27/14
[52] U.S. Cl. ..................................... 257/434; 257/461; 257/465; 257/184; 257/914; 257/459
[58] Field of Search ............... 257/458, 434, 433, 432, 257/461, 465, 463, 81, 82, 441, 184, 185, 188, 189, 914, 459

[56] References Cited

U.S. PATENT DOCUMENTS

| | | | |
|---|---|---|---|
| 3,703,669 | 11/1972 | London ................................ | 257/461 |
| 4,011,016 | 3/1977 | Layne et al. ...................... | 257/461 X |
| 4,323,719 | 4/1982 | Green ................................ | 257/461 X |
| 4,330,680 | 5/1982 | Goetzberger ...................... | 257/461 X |
| 5,177,581 | 1/1993 | Kubo et al. ....................... | 257/461 X |
| 5,233,209 | 8/1993 | Rodgers et al. .................. | 257/185 X |

FOREIGN PATENT DOCUMENTS

| | | | |
|---|---|---|---|
| 186460 | 7/1986 | European Pat. Off. . | |
| 216572 | 4/1987 | European Pat. Off. . | |
| 473197 | 3/1992 | European Pat. Off. . | |
| 538878 | 4/1993 | European Pat. Off. . | |
| 54-13783 | 2/1979 | Japan ................................. | 257/434 |
| 57-164585 | 10/1982 | Japan ................................. | 257/434 |
| 59-219957 | 12/1984 | Japan ................................. | 257/443 |
| 61-289677 | 12/1986 | Japan . | |
| 63-182874 | 7/1988 | Japan ................................. | 257/465 |

OTHER PUBLICATIONS

Forbes, "Photodiode Having Ion Implant for Improved Light Sensitivity," IBM Technical Disclosure Bulletin, vol. 15, No. 4, Sep. 1972, p. 1348.

Patent Abstract of Japan, vol. 11, No. 152 (E-507) 16 May 1987.

Schlafer et al, "A Hermetic Fiber-Coupled P-I-N Photodetector Package for use in Fiber-Optic Preamplifier Circuits", *Journal of Lightwave Technology*, vol. Lt3, No. 6, New York, pp. 1321-1323 (Dec. 1985).

*Primary Examiner*—William Mintel
*Attorney, Agent, or Firm*—Beveridge, DeGrandi, Weilacher & Young

[57] ABSTRACT

This invention relates to a photodetector including a package having a window disposed in a light incident part, and a light detecting element installed in the package. The light detecting element includes a first region formed of a second conduction-type semiconductor and embedded in a first conduction-type semiconductor layer; a second region formed of second conduction-type semiconductor and embedded so as to be spaced from and to surround the first region; and a conductor layer provided both on at least one part of top surface of the first conduction-type semiconductor layer and on at least one part of top surface of the second region. The first region is surrounded by a second conduction-type second region. On the surface of the semiconductor crystal layer, an electrode is formed on the first region, and a reflection preventing layer is formed on that part of the first region inside the electrode, and a device protecting film is formed on that part of the first region outside the electrode. On the semiconductor crystal layer, a metal film is formed in contact both with the semiconductor crystal layer and with a second region. This structure enables the second region to capture unnecessary charges and further to recombine and extinguish them.

28 Claims, 7 Drawing Sheets

PHOTODETECTOR WITH SURROUNDING REGION

BACKGROUND OF THE INVENTION

1. Field of the Invention

This invention relates to a photodetector for use in light output monitoring devices of semiconductor lasers, receiving devices of optical communication systems, etc.

2. Related Background Art

FIG. 1A is a top view of the structure of a conventional light detecting element, and FIG. 1B is a sectional view along the line X—X' in FIG. 1A. As shown, the conventional light detecting element comprises a first conduction-type semiconductor substrate 1 with a first electrode 8 formed on the underside; a first conduction-type semiconductor crystal layer 2 including a light absorbing layer; and a second conduction-type first region 3 formed in the first conduction-type semiconductor crystal layer 2 by selectively diffusing a dopant. Thus formed is a pin photodiode structure. This pin photodiode structure includes an n-layer (or a p-layer) provided by the semiconductor substrate 1, a p-layer (or an n-layer) provided by a first region 3, and a light detecting region 10 provided by the pn junction (the depletion layer or the i layer). A second electrode 5 is provided on the first region 3 in the semiconductor crystal layer 2. The top of the first region 3 inside the electrode 5 is covered with a reflection preventive film 6, and the top of semiconductor crystal layer 2 outside the electrode 5 is covered with a device protective film 7.

In the semiconductor device of the above-described structure, when an reverse bias is applied, an electric field is generated in the depletion layer. Electrons and holes generated by incident light on a light detecting region 10 are divided respectively to the first conduction-type region 3 and are accelerated. Thus a photocurrent can be taken outside, and an optical signal can be detected.

In the above-described structure of FIG. 1A and 1B, when light is incident on the light detecting region 10, photo-carriers are generated in the depletion layer, and a good response characteristic can be obtained. But when light is incident outside the light detecting region 10, due to a density gradient, the generated carriers are diffused to reach the depletion layer, and are taken out in a photocurrent. The transfer of the diffused carriers is slow. When the carriers reach the light detecting region 10, adversely a tail is generated at the last transition of a light-pulse-responding waveform as shown in FIG. 2.

In using such light detecting element in photodetectors for use in optical communication, etc., a lens 11, such as a spherical lens, a SELFOC lens or others, is disposed at the light incident part of the cap of the package as shown in FIG. 3 so as not to affect the response characteristic. This arrangement enables all the signal light emitted from an optical fiber or others to be focussed to be incident on the light detecting region 3. But this condensation increases an incident light intensity per a unit area of signal light incident on the light detecting region 3, and accordingly more carriers are generated in the depletion layer 10. Resultantly because of the space-charge effect produced by an increase of a carrier density in the depletion layer 10, the intensity of an electric field in the depletion layer 10 is decreased, and a drift rate of the carriers in the depletion layer 10 is lowered. Also tails occur at the falls of light pulse response waveforms. In view of this, the light amount to be incident on the light detecting element 20 has to be limited, and it is a problem that a maximum incident light amount on the semiconductor photodetector cannot be increased. This effect is more conspicuous especially when the reverse bias voltage is low, which makes it difficult to operate the semiconductor photodetectors at low bias voltages.

In controlling a light output of a laser diode to be constant, the light emitted from the rear end surface of the laser diode is detected by a light detecting element, and an operating current of the laser diode is feed-back controlled. But because the light output of the laser diode is so intense that when light is focussed and incident on the light detecting region 3, the space-charge effect occurs, and as described above, the drift of the carriers is increased, and tails occur at the falls of response waveforms. The feed-back control of the laser diode is affected.

SUMMARY OF THE INVENTION

An object of this invention is to provide a semiconductor photodetector which can solve the above-described problems.

To this end, a photodetector according to the present invention comprises a package in which a window is provided in a light incident portion, and a light detecting element is located within the package, the light detecting element comprising: a first region formed of second conduction-type semiconductor and embedded in a first conduction-type semiconductor layer; a second region formed of second conduction-type semiconductor and embedded so as to be spaced from and surround the first region; and a conductor layer provided both on at least one part of top surface of the first conduction-type semiconductor layer and on at least one part of top surface of the second region.

In the semiconductor photo-detecting device, a window provided in the package is a simple through hole and any lens is not used in the package. A signal light, therefore, is not concentrated in a light receiving region of the photo-detecting element and the signal light is also incident on an outside of the light receiving region. As a result, the intensity of the signal light incident on the light receiving region decreases degrade the response characteristics due to space charge effect may be prevented. Further, it may be to make signal light having a large intensity incident into the photo-detecting device without limiting the amount of the signal light.

Further, the similar effect may be also realized in using a transparent plate in the light incident portion.

According to the above-described light detecting element, even if incident light leaks outside the light detecting region which is the pn junction formed between the first conduction-type semiconductor layer and the first region and adversely generates carriers, the carriers are absorbed by the second region with the result that the flow of the diffused carriers into the light detecting region can be prevented. Consequently a necessary photocurrent alone can be taken out to an outside circuit. Decrease of a response speed of the device can be prevented.

The first conduction-type semiconductor layer and the second region are short-circuited by a conductor layer of a metal, a semiconductor or others formed over their top surfaces, and carriers absorbed by the second region can be recombined or extinguished. Accordingly carriers are not accumulated in the second region. Even when a light pulse of very high intensity is incident, no tail is generated at the last transition of a response waveform for the light pulse. Thus, electric and optical characteristics of the device can be improved.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
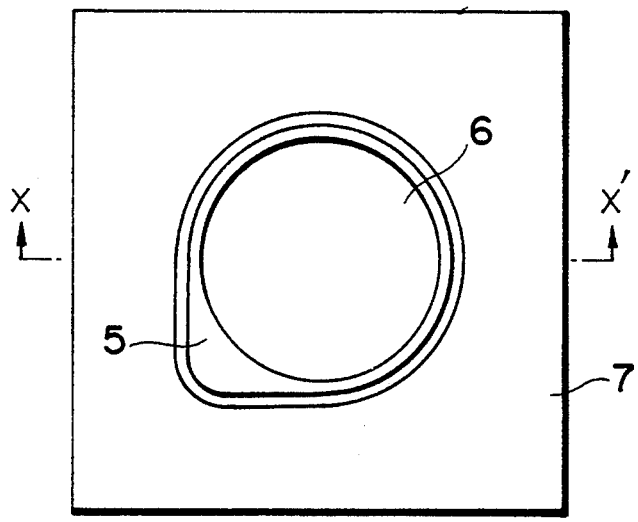
FIG. 1A is a plan view of a light detecting element used in a conventional photodetector for explaining the structure thereof.
Figure 1B:
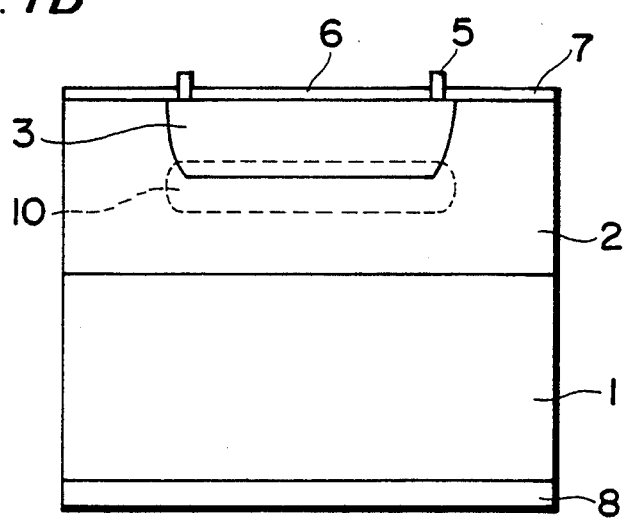
FIG. 1B is a sectional view of the light detecting element along X—X'.
Figure 2:
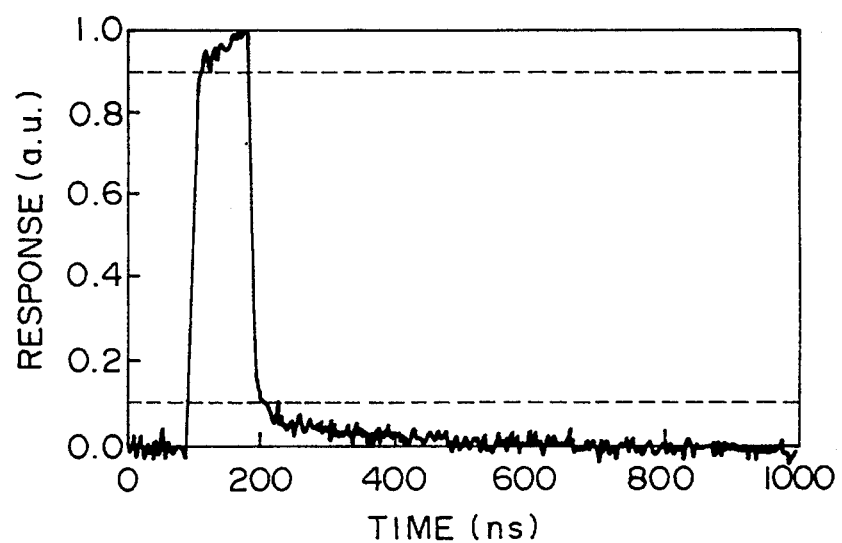
FIG. 2 is a graph of the light pulse characteristic of the conventional light detecting element.
Figure 3:
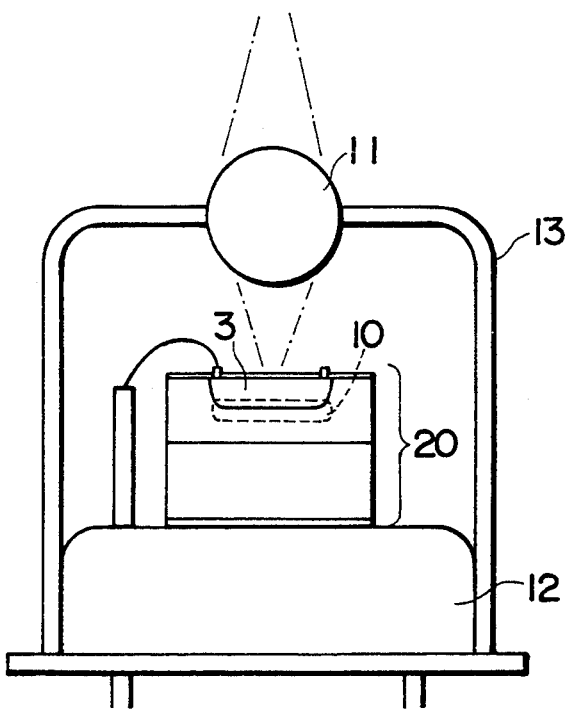
FIG. 3 is a sectional view of the conventional photodetector for explaining the structure thereof.
Figure 4A:
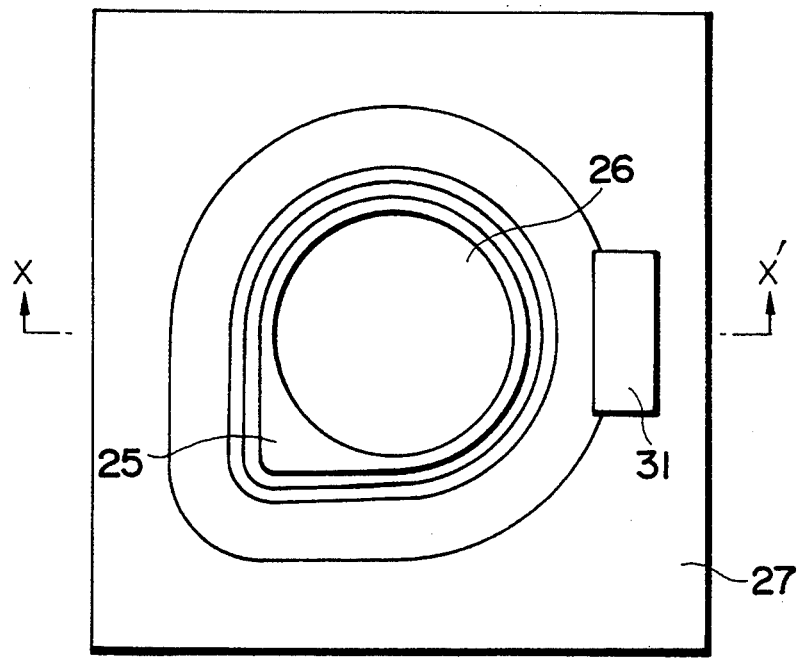
FIG. 4A is a plan view of a light detecting element for use in the photodetector according to a first embodiment of this invention.
Figure 4B:
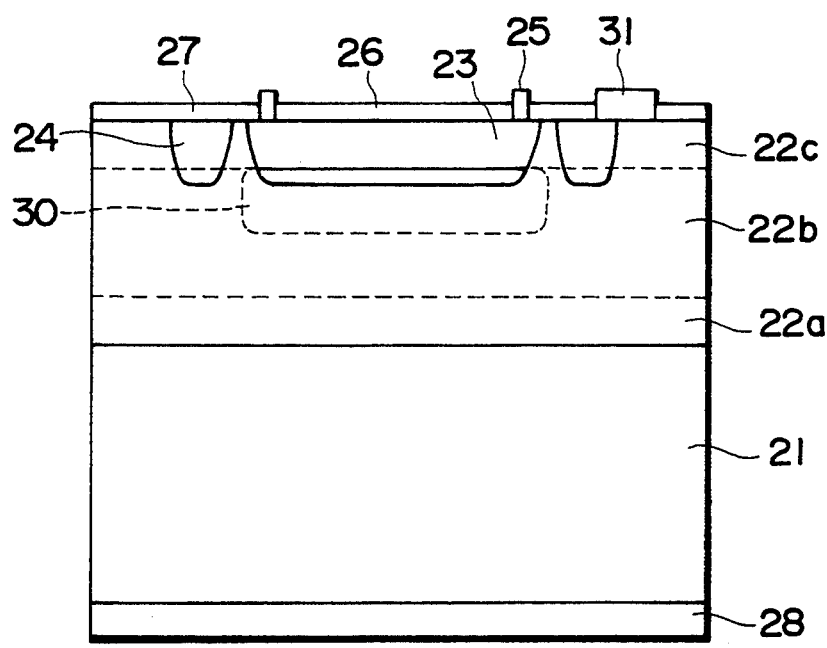
FIG. 4B is a sectional view of the light detecting element along X—X'.

A first embodiment of this invention will be explained with reference to FIGS. 4A and 4B, and FIG. 5. FIG. 4A is a top view of the light detecting device according to the first embodiment, and FIG. 4B is a sectional view along the line X—X'. On an n+InP (Indium-Phosphide) semiconductor substrate 21 with an n-electrode 28 formed on the underside, there are formed a non-doped InP buffer layer 22a (carrier concentration: $n = 2 \times 10^{15} cm^{-3}$, thickness: 2 $\mu m$), a non-doped InGaAs (Indium-Gallium-Arsenide) light-detecting layer 22b ($n = 3 \times 10^{15} cm^{-3}$, thickness: 3.5 $\mu m$), and a non-doped InP window layer 22c ($n = 1 \times 10^{15} cm^{-3}$, thickness: 2 $\mu m$) for decreasing a dark current. In the light detecting layer 22b and the window layer 22c, there are formed a p-type first region 23 and a p-type second region 24 by selectively diffusing Zn. The first region has a 200 $\mu m$-diameter, and the second region 24(charge trapping region) has a 40 $\mu m$-width. The n-type region between the first region 23 and the second region 24 around the first region 23 has a 10 $\mu m$-width. A p-electrode 25 is formed on the first region 23, and a reflection reducing film or antireflection film 26 is formed on that part of the region 23 inside the electrode 25, and a device protecting film or passivation film 27 is formed on that part of the first region 23 outside the electrode 25 and the window layer 22c including the second region 24.

In this structure, electrons and holes generated by incident light on the light detecting region 30 are divided respectively toward the semiconductor substrate 21 and the first region 23, and are accelerated. Consequently a photocurrent can be taken outside, and an optical signal can be detected. If light is incident on parts other than the light detecting region 30, generated unnecessary carriers are captured by a built-in potential formed in the second region 24 embedded in the semiconductor crystal layers 22a, 22b, 22c and are hindered from entering the light detecting region 30. Eventually a photocurrent necessary for detecting an optical signal can be taken out.

But a part of the carriers absorbed and trapped by the second region 24 is recombined and extinguished in the semiconductor crystal layer, but the other part accumulates in the second region 24. Especially when a light pulse of high intensity is inputted, a ratio of carriers extinguished by recombination is low, and most remaining carriers are accumulated in the second region 24. Resultantly a built-in potential formed in the second region becomes weak, and a ratio of carriers trapped by the second region is lowered. Diffused carriers having a lower transfer speed flow into the light detecting region 30, and a tail is generated at the last transition of a response waveform for the light pulse. Thus, electric and optical characteristics of the device are affected.

The above-described affection is more remarkable especially in the case that the second region 24 is not exposed at the end surface of the second region 24. In this case, recombinations and extinctions of the carriers hardly take place, and carriers are accordingly accumulated in the second region 24. In this state, as described above, electric and optical characteristics are affected. In the case that the second region 24 is exposed at an end surface of the device, carriers tend to leak at the end surface and to be recombined. Consequently most carriers are not accumulated in the second region 24, and accordingly a built-in potential in the second region 24 does not tend to be lowered. Consequently a ratio of carriers trapped by the second region 24 does not lower with the result that electric and optical characteristics are not seriously affected. However, in applying the light detecting device according to this embodiment to various optical devices, it is necessary to extinguish generated carriers more quickly to maintain a state in which no carriers are accumulated in the second region 24 even when light of high intensity is inputted.

Here to eliminate the above-described influence, in addition to the above-described structure, as shown in FIGS. 4A and 4B, a metal film 31 is formed on the semiconductor crystal layers 22a, 22b, 22c so as to be in contact both with the p-type second region 24 and with the n-type region outside the second region 24. This metal film 31 is formed by alloying Au/Zn/Au and is in contact over a 10 $\mu m$-width both with the second region 24 and with the n-type region outside the second region 24. The area of the metal film 31 is 20 μm×40 μm.

It is preferable that the light detecting layer 22b has a thickness of 2~7 μm for good absorbing efficiency of incident light, but the width is not necessarily limited to this range. The n-type region between the p-type first region 23 and the p-type second region 24 preferably has a width of 2~40 μm, but the width is not necessarily limited to the range. The shape and width of the metal film 31 in contact with the n-type region and with the p-type second region 24 are not necessarily limited to the above.

In the above-described structure, when light is incident on regions other than the light detecting region 30, unnecessary generated carriers are captured by the second region 24 which is a charge trapping region. Consequently no tail is generated at the last transition or the fall of a light pulse, and only a photocurrent necessary for the detection of an optical signal can be taken out. The captured carriers are recombined and extinguished by the metal film 31 short-circuiting the window layer 22c and the second region 24 and are not accumulated in the second region 24. Accordingly a ratio of carriers captured by the second region 24 is not lowered, and electric characteristics and optical characteristics are not affected. In terms of the structure, it is not necessary to provide an extra electrode and connect the same to the electrode 28 in order to take out accumulated carriers. The device can have a simplified structure. The diameter of the region 23, etc. is not limited to this embodiment.

Figure 5:
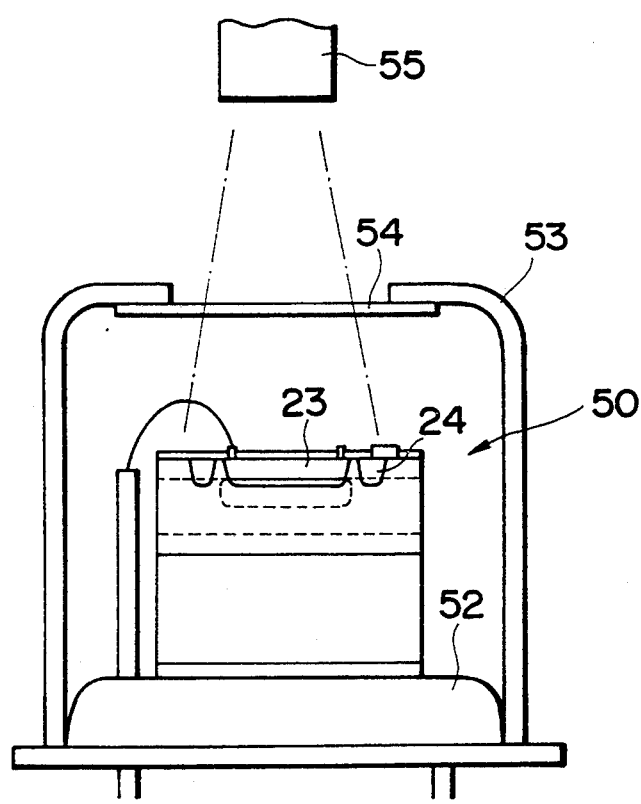
FIG. 5 is a sectional view of the photodetector according to a second embodiment of this invention.

FIG. 5 shows a photodetector using the above-described light detecting element. In this photodetector the light detecting element shown in FIGS. 4A and 4B is mounted on a constituent member 52 covered with a cap 53 of a package. A window of a light transmitting plate 54 is disposed at a required position so that light can be incident on a light detecting region 23 of the light detecting element 50.

Because this photodetector uses no lens, signal light emitted from an optical fiber 55 is not focussed onto the light detecting region 23 but is incident on the light detecting element 50 divergently outside the light detecting region 23. In this structure, even when light is incident outside the light detecting region 23, unnecessary generated carriers are trapped in a second region 24 and extinguished. Accordingly it is not necessary to focus signal light so that the signal light is incident only on the light detecting region 23, and to restrict, to this end, a light amount to be incident on the photodetector.

Figure 6A:
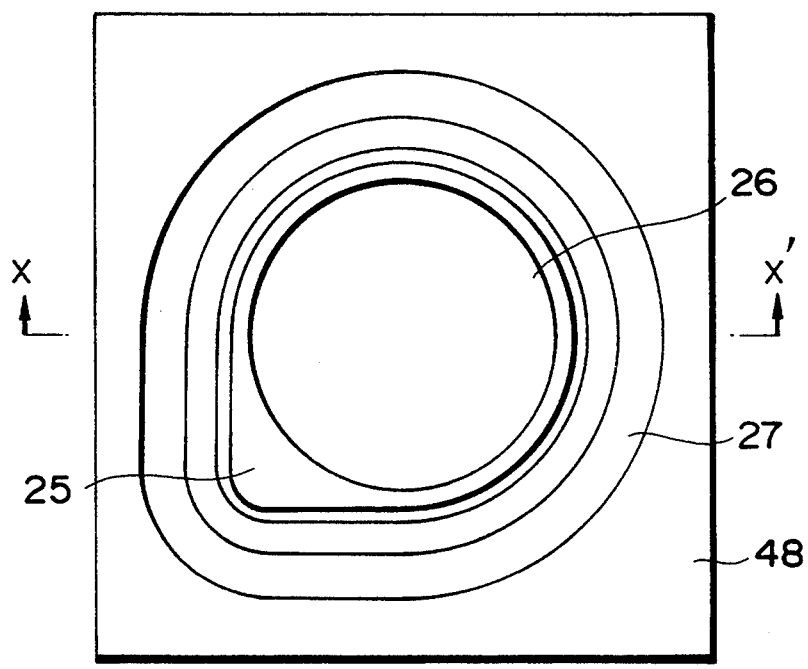
FIG. 6A is a plan view of a light detecting element for use in the photodetector according to the second embodiment of this invention.
Figure 6B:
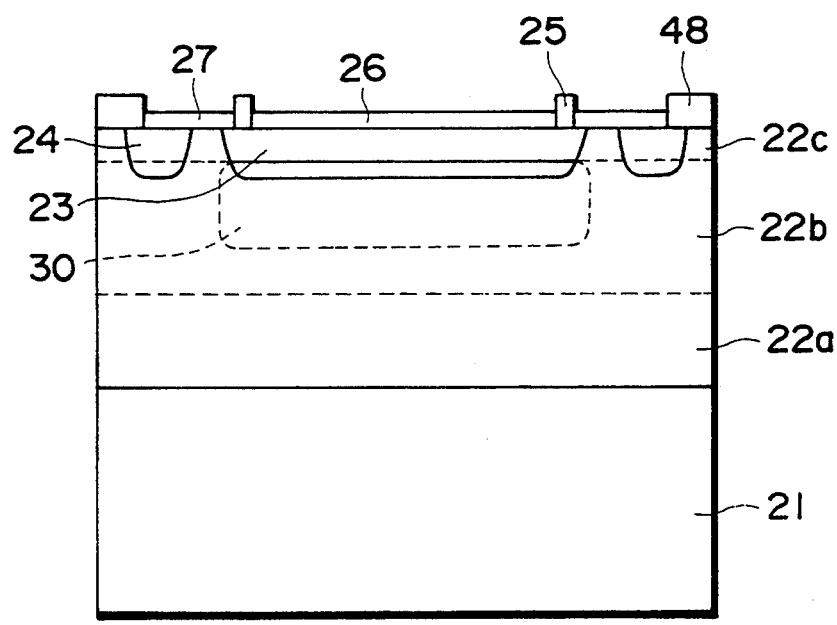
FIG. 6B is a sectional view of the light detecting element along X—X'.

The photodetector according to a second embodiment of this invention will be explained. The mounting of the light detecting element on the package in the second embodiment is the same as in the first embodiment, and will not be explained here. The structure and function of the light detecting element will be explained with reference to FIGS. 6A and 6B. FIG. 6A is a top view of the light detecting element according to this embodiment, and FIG. 6B is a sectional view along the line X—X′. On a Fe doped InP substrate 21 (specific resistance: $\rho = 1 M\Omega.cm$), there are formed a non-doped InP buffer layer 22a ($n = 1 \times 10^{15} cm^{-3}$, thickness: 1 μm), a non-doped InGaAs light detecting layer 22b ($n = 1 \times 10^{15} cm^{-3}$, thickness: 4 μm), and a non-doped window layer 22c ($n = 2 \times 10^{15} cm^{-3}$, thickness: 3 μm). In the light detecting layer 22b and the window layer 22c there are formed a p-type first region 23 and a p-type second region 24 by selectively diffusing Zn by ampul or sealed tube method. The first region has a 300 μm-diameter. Because of this region 23, a structure including the pn junction as the light detecting region 30 can be provided. The n-type region between the first region 23 and the second region 24 has a 20 μm-width. On the first region 23 there is provided a p-electrode 25. An antireflection film 26 is provided on that part of the region 23 inside the electrode 25, and a device protecting film 27 is formed on that part of the region 23 outside the electrode 25 and on the second region 24 in the window layer 22c. An n-electrode 48 for the light detecting device is formed on that part of the InP window layer 22c outside the second region 24 and on a part of the second region 24. The n-electrode 48 has a 330 μm-inner diameter and is over the second region 24 by 5 μm.

In the above-described structure, the electrode 48 formed in contact with both the p-type second region 24 and the n-type window layer 22c can function as the n-electrode 28 (FIG. 4B) for taking out a photoelectric current, and as the metal film 31 (FIGS. 4A and 4B) for recombining carriers captured by the second region (charge trapping region) 24. The second embodiment has a simple structure but can produce the same advantageous effect as the first embodiment.

Figure 7A:
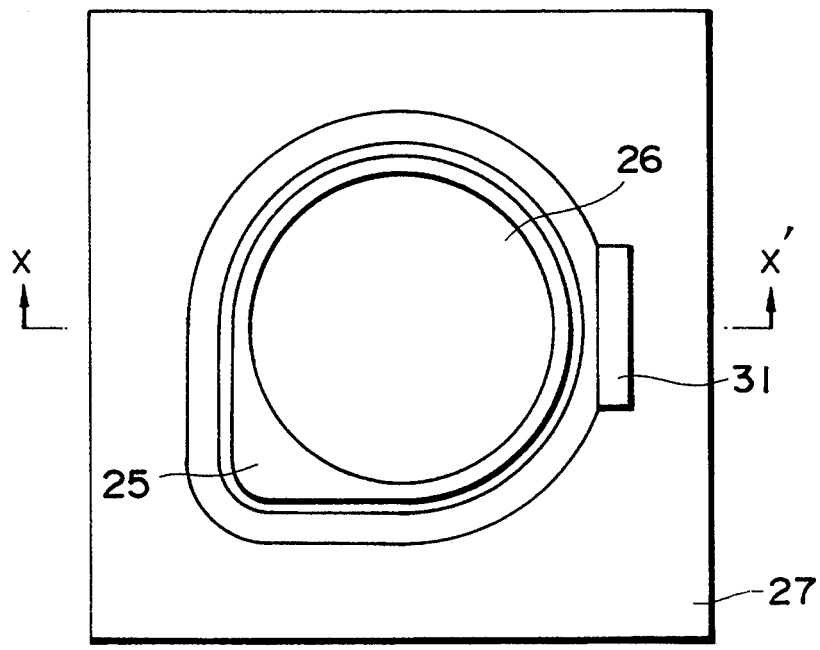
FIG. 7A is a plan view of a light detecting element for use in the photodetector according to a third embodiment of this invention, which explains the structure thereof.
Figure 7B:
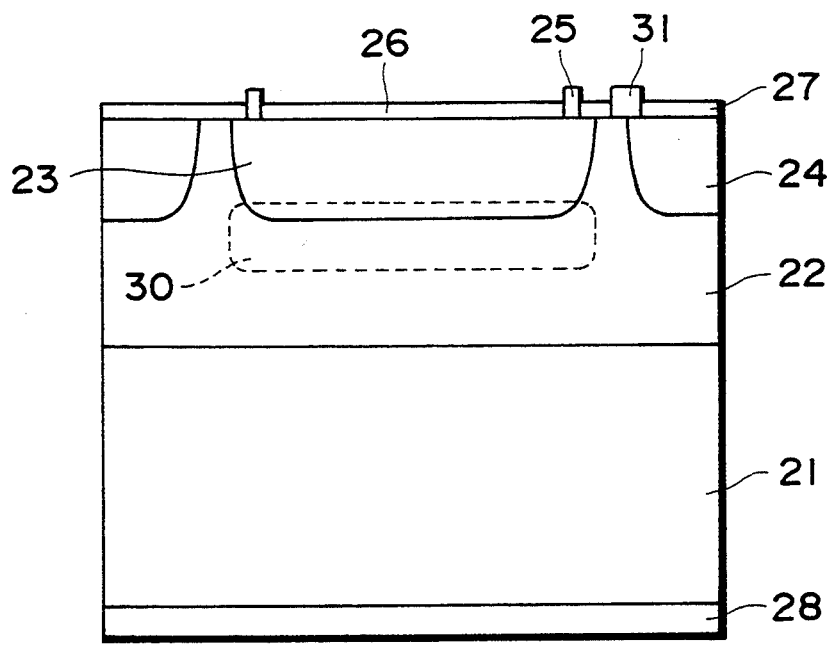
FIG. 7B is a sectional view of the light detecting element along X—X'.

The photodetector according to a third embodiment of this invention will be explained. The mounting of the photodetecting element on the package in the third embodiment is the same as in the first embodiment, and will not be explained here. The structure and function of the light detecting element will be explained with reference to FIGS. 7A and 7B. FIG. 7A is a top view of the light detecting element according to the third embodiment of this invention, and FIG. 7B is a sectional view along the line X—X′. As shown, on the surface of an n-type (first conduction-type) semiconductor substrate 21 with an n-electrode 28 formed on the underside, there is formed an n-type semiconductor crystal layer 22. A p-type (second conduction-type) first region 23 is formed on the semiconductor crystal layer 22 by diffusing a dopant by ampul method. The first region 23 has a 300 μm-diameter. The first region 23 forms a pn junction which is a light detecting region 30. This first region 23 is surrounded by a p-type second region 24 which is formed as a charge trapping region by diffusing a dopant. The second region 24 is spaced from the first region 23 by 20 μm. A p-type (second conduction-type) electrode 25 is provided on the first region 23. An antireflection film 26 is formed on that part of the first region 23 inside the electrode 25, and a device protecting film 27 is formed on that part of the first region 23 outside the electrode 25 and on the semiconductor crystal layer 22 including the second region 24. A metal film 31 is provided in contact with the semiconductor crystal layer 22 and with the second region 24. In this embodiment, the metal film 31 contacts over a 5 μm-width respectively with the semiconductor crystal layer 22 and with the second region 24 so that carriers captured by the second region can be recombined and annihilated. The metal film 31 has an area of 10 μm×50 μm.

In this structure as well as that according to the first embodiment, unnecessary carriers are collected in the second region further to be recombined and extinguished by the metal film 31. Accordingly diffused carriers never affect electric characteristics of the device, such as response speed etc., and optical characteristics thereof. But a disadvantage of this embodiment is that because of the location of the metal film 31, whose reflectance is high, near the first region 23, in comparison with the first embodiment light tends to leak to the surroundings.

The semiconductor materials and their dimensions referred to above are merely exemplified and can be varied in accordance with applications, wavelengths to be used, etc. For example, the materials of the semiconductors may be compound semiconductors, such as GaAs (Gallium-Arsenide), InGaAsP (Indium-Gallium-Arsenide-Phosphide), AlGas (Aluminium-Gallium-Arsenide), CdTe (Cadmium-Telluride), HgCdTe (Mercury-Cadmium-Telluride), InSb (Indium-Antimonide). etc., or Si (Silicon), Ge (Germanium), etc. In the case that AlGaAs is used for the light absorbing layer, GaAs or others, for example, can be used for the window layer. As dopants, Be (Beryllium), Cd (Cadmium), etc. may be used. The dopants may be added by ion implantation or others. The second region and the semiconductor crystal layer is not necessarily short-circuited by a metal film, but may be short-circuited by a semiconductor layer. The metal film may be formed e.g., by vacuum evaporating an AuGeNi alloy or by depositing Au/Ge/Ni on the semiconductor crystal layer and alloying the same. The semiconductor layer may be provided by, e.g., amorphous silicon.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A photodetector including a package having a window disposed in a light incident part, and a light detecting element installed in the package, the light detecting element comprising:
   a first conduction-type semiconductor layer;
   a first region formed of a second conduction-type semiconductor and embedded in the first conduction-type semiconductor layer;
   a second region formed of the second conduction-type semiconductor and embedded so as to be spaced from the first region and so as to surround the first region; and
   a conductor layer provided both on at least one part of a top surface of the first conduction-type semiconductor layer and on at least one part of a top surface of the second region.

2. A photodetector according to claim 1, wherein the window is formed of a light transmitting plate.

3. A photodetector according to claim 1, wherein the conductor layer is a metal film.

4. A photodetector according to claim 1, wherein the conductor layer is a conductive semiconductor layer.

5. A photodetector according to claim 1, wherein the second region has an annular shape, and the conductor layer is provided on a surface area including a boundary between the second region and a part of the first conduction-type semiconductor layer outside the second region.

6. A photodetector according to claim 1, wherein the conductor layer is provided on a surface area including a boundary between the second region and a part of the first conduction-type semiconductor layer between the first and the second regions.

7. A photodetector according to claim 1, wherein a first output electrode is connected to the top surface of the first region, and a second output electrode is connected to the underside of a substrate provided on the underside of the first conduction-type semiconductor layer.

8. A photodetector according to claim 5, wherein a first output electrode is connected to the top surface of the first region, and a second output electrode is provided by the conductor layer.

9. A photodetector according to claim 1, wherein the first conduction-type semiconductor layer comprises a buffer layer formed on a substrate, a light absorbing layer formed on the buffer layer, and a window layer formed on the light absorbing layer; and the second region is extended from the window layer to the light absorbing layer.

10. A photodetector according to claim 1, wherein the conductor layer partially covers the boundary between the surface of the first conduction-type semiconductor layer and the surface of the second region.

11. A photodetector claim 3, wherein the metal film is formed of an AuZn alloy.

12. A photodetector according to claim 3, wherein the metal film is formed of an AuGeNi alloy.

13. A photodetector according to claim 4, wherein the conductive semiconductor layer is formed of amorphous Si.

14. A photodetector according to claim 1, wherein the first conduction-type semiconductor layer is formed of InGaAs.

15. A photodetector according to claim 1, wherein the first conduction-type semiconductor layer is formed of GaAs.

16. A photodetector according to claim 1, wherein the first conduction-type semiconductor layer is formed of InGaAsP.

17. A photodetector according to claim 1, wherein the first conduction-type semiconductor layer is formed of AlGaAs.

18. A photodetector according to claim 1, wherein the first conduction-type semiconductor layer is formed of CdTe.

19. A photodetector according to claim 1, wherein the first conduction-type semiconductor layer is formed of HgCdTe.

20. A photodetector according to claim 1, wherein the first conduction-type semiconductor layer is formed of InSb.

21. A photodetector according to claim 1, wherein the first conduction-type semiconductor layer is formed of Si.

22. A photodetector according to claim 1, wherein the first conduction-type semiconductor layer is formed of Ge.

23. A photodetector according to claim 1, wherein the first and the second regions are formed by the diffusion of Zn.

24. A photodetector according to claim 1, wherein the first and the second regions are formed by the diffusion of Be.

25. A photodetector according to claim 1, wherein the first and the second regions are formed by the diffusion of Cd.

26. A photodetector according to claim 6, wherein a first output electrode is connected to the top surface of the first region, and a second output electrode is provided by the conductor layer.

27. A photodetector according to claim 3, wherein the metal film is formed of TiAu.

28. A photodetector according to claim 1, wherein the first conduction-type semiconductor layer is formed of InP.

* * * * *